United States Patent [19]
Pryor

[11] Patent Number: 5,483,920
[45] Date of Patent: Jan. 16, 1996

[54] METHOD OF FORMING CUBIC BORON NITRIDE FILMS

[75] Inventor: Roger W. Pryor, Bloomfield Township, Mich.

[73] Assignee: Board of Governors of Wayne State University, Detroit, Mich.

[21] Appl. No.: 102,605

[22] Filed: Aug. 5, 1993

[51] Int. Cl.$^6$ ................................... C30B 23/08
[52] U.S. Cl. .................... 117/106; 117/108; 117/109; 117/952
[58] Field of Search ..................... 117/106, 108, 117/109, 952

[56] References Cited

U.S. PATENT DOCUMENTS

| | | | |
|---|---|---|---|
| 5,080,753 | 1/1992 | Doll et al. | 117/952 |
| 5,081,053 | 1/1992 | Heremans et al. | 148/DIG. 149 |
| 5,096,740 | 3/1992 | Nakagama et al. | |
| 5,139,591 | 8/1992 | Doll et al. | 117/952 |
| 5,227,318 | 7/1993 | Doll et al. | 148/DIG. 113 |
| 5,330,611 | 7/1994 | Doll | 117/108 |

FOREIGN PATENT DOCUMENTS

| | | |
|---|---|---|
| 0412301A1 | 9/1990 | European Pat. Off. . |
| 0476825A1 | 9/1991 | European Pat. Off. . |
| 03263830 | 11/1991 | Japan ................. 117/105 |

*Primary Examiner*—Robert Kunemund
*Attorney, Agent, or Firm*—Dykema Gossett

[57] ABSTRACT

A novel method of forming large area single crystal cubic boron nitride films on a silicon substrate by first treating the surface of the substrate with atomic hydrogen and then depositing a cubic boron nitride film by a reactive biased laser ablation technique.

20 Claims, 3 Drawing Sheets

METHOD OF FORMING CUBIC BORON NITRIDE FILMS

This invention was made with Government support, under Contract No. SGER ECS 91 07645 awarded by the National Science Foundation. The Government has certain rights in the invention.

FIELD OF THE INVENTION

The present invention generally relates to an improved method of forming large area single crystal cubic boron nitride films on a silicon substrate and more particularly relates to an improved method of forming large area single crystal cubic boron nitride films on a silicon substrate by first treating the surface of the silicon substrate with atomic hydrogen and then depositing a cubic boron nitride film by a reactive biased laser ablation technique.

BACKGROUND OF THE INVENTION

Boron nitride (BN) has become a very important industrial material in recent years. It has many desirable physical properties. It can be a wide band gap semiconductor with high thermal conductivity and chemical inertness or a thermal insulator. Boron nitride exits in at least two crystal structures, i.e. hexagonal and cubic. Boron nitride that has the cubic crystalline structure, commonly known as cubic boron nitride (or cBN) is of particular interest to the electronics industry. This is due to its ability to be doped as a semiconductor of p or n type and also for its stability at high temperatures.

One method of producing BN by chemically transporting boron by $H_2+N_2$ plasma is disclosed in J. Mat. Sci. Let., 4 (1985) 51–54. Another method of producing a BN film by depositing boron on a substrate from a boron vapor source and simultaneously irradiating ion species containing nitrogen onto the substrate was disclosed by Japanese patent Kokai Publication No. 181,262/1985. Still another method of producing BN by evaporating boron with a hollow cathode discharge source while ionizing nitrogen with an electrode and irradiating ionized nitrogen onto a substrate on which radio frequency wave is applied to produce boron nitride on a substrate is disclosed by Inagawa, et al., Proceedings of Ninth Symposium on Ion Source Assisted Technology '85, Tokyo, 299–302 (1985). However, none of these conventional methods is capable of producing a cubic boron nitride film that is single phase and single crystal. The BN films produced by these methods frequently contain hexagonal boron nitride and/or amorphous boron nitride.

More recently, a method that claims growing cBN on silicon wafers by using a laser ablation technique is disclosed in U.S. Pat. No. 5,096,740 to Doll, et al. In the Doll method, it is claimed that single crystal cubic boron nitride films were epitaxially grown on a silicon substrate oriented along the (100) axis such that the resulting cubic boron nitride films are in epitaxial registry with the underlying silicon substrate.

Another recent work disclosed by Nakagama, et al. in U.S. Pat. No. 5,096,740 also claimed a method of producing cubic boron nitride films by laser deposition. The Nakagama, et al. method comprises irradiating an excimer laser on a target comprising boron atoms and optionally nitrogen atoms and depositing cubic boron nitride on a substrate which is placed facing the target wherein a discharge of a gas comprising nitrogen atoms is formed between the target and the substrate.

Neither the Doll, et al. method nor the Nakagama, et al. method produces cBN films of high purity and high crystallinity. Furthermore, the bond formed between the silicon substrate and the cBN film is weak such that failure of the bond occurs in applications, especially at high temperatures.

It is therefore an object of the present invention to provide a method of forming cubic boron nitride films on silicon substrates that does not have any of the drawbacks of the prior art methods.

It is another object of the present invention to provide a method of forming single crystal cubic boron nitride films on silicon substrates that utilizes a pretreatment step on the substrate by hydrogen atoms.

It is yet another object of the present invention to provide a method of forming single crystal cubic boron nitride films on silicon substrates by utilizing a reactive biased laser ablation technique.

It is a further object of the present invention to provide a a method of forming single crystal cubic boron nitride films on silicon substrates such that films of high purity and high crystallinity can be produced.

It is another further object of the present invention to provide an improved method of forming single crystal cubic boron nitride films on silicon substrates utilizing a reactive laser ablation technique in which a biased ring is used to further energize a laser plume.

It is yet another further object of the present invention to provide a semiconductor device comprising a silicon substrate coated with a single crystal cubic boron nitride film by an improved reactive biased laser ablation technique.

SUMMARY OF THE INVENTION

In accordance with the present invention, an improved method of forming single crystal cubic boron films on silicon substrates is provided.

In the preferred embodiment, the improved method is provided by utilizing a reactive biased laser ablation technique in which the surface of a silicon substrate is first pretreated with atomic hydrogen and then irradiated with a laser plume energized by at least one biased ring. A heteroepitaxial cubic boron nitride layer is then deposited under biased conditions in a nitrogen/argon or nitrogen atmosphere.

The boron nitride source material used is a hexagonal boron nitride (or hBN) target. An atomic hydrogen pretreatment of the silicon substrate prepares the bond structure of the Si surface for the growth of cBN layer. The bias ring in the ablation system supplies additional energy to the ablation plume and more efficiently ionizes the local nitrogen gas. The increased energy in the plume enhances surface atom mobility and thus forming a cBN film having higher purity and higher crystallinity. The ionized nitrogen helps maintaining the stoichiometry of cBN, since BN from the hBN target tends to become nitrogen deficient during the laser ablation process.

The present invention is further directed to a free-standing single crystal cubic boron nitride film having high purity and high crystallinity or a semiconductor device comprising a silicon substrate coated with a single crystal cubic boron nitride film that has improved bond strength between the silicon and the cBN and high purity and high crystallinity in the cBN. The semiconductor device may also contain several layers of cubic boron nitride doped to different p and n state such that the article can be used as a transistor, a diode, a rectifier, a resistor or any other microelectronic device.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED EMBODIMENT

The present invention discloses an improved method of forming single crystal cubic boron nitride films on silicon substrates by first pretreating a substrate surface with hydrogen atoms and then irradiating the substrate surface with a reactive, biased laser ablation technique. The present invention is more preferably used to form large area single crystal cubic boron nitride films. The term large area, for the purpose of the present invention, refers to an area of about 1 $cm^2$ or larger.

Many pulsed laser techniques for the deposition of thin films have been used in recent years. The thin films that can be made by these methods include a wide variety of different materials such as polymers, semiconductors, dielectric materials, and superconductors. Such thin films can have different degrees of crystallinity. In a typical pulsed laser deposition process, a substrate of a suitable material is maintained at an elevated temperature and placed opposite to a target that has a composition the same or similar to the desired film. A focused pulsed laser beam from an excimer laser source is then incident on the target at an angle of approximately 45 degrees. The deposition process is performed in a vacuum or other appropriate atmosphere such as oxygen or nitrogen.

The pulsed laser deposition process can have advantages over other conventional deposition techniques, such as chemical vapor deposition and sputtering. For instance, it has a slower deposition rate, uses a smaller target, and has the ability to deposit materials with high melting temperatures such as refractory materials.

While the technique of pulsed laser deposition of thin films has been used by others, the present invention provides a greatly improved method of using a pulsed laser more efficiently in the deposition of thin films of single crystal cubic boron nitride. This greatly improved method including steps of first pretreating a silicon substrate with atomic hydrogen, and then irradiating the treated surface with a bias ring energized laser plume to deposit single crystal cBN.

Figure 1:
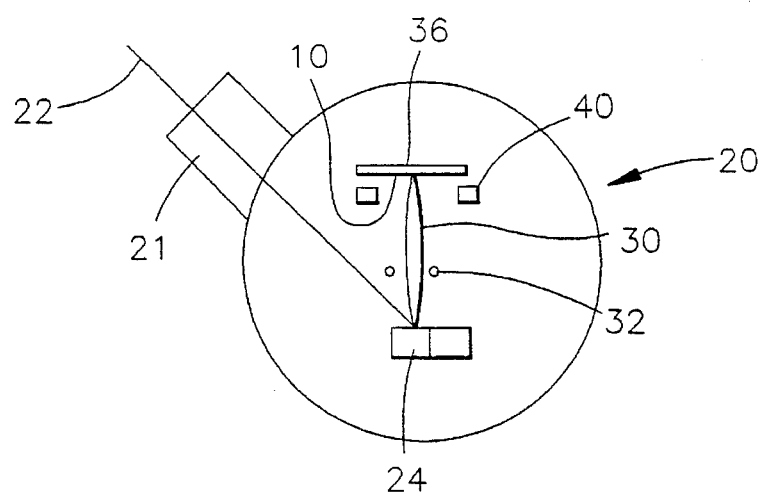
FIG. 1 is a cross-sectional view of a reactive, biased laser ablation deposition apparatus.

This novel laser deposition technique is carried out by first providing a single crystal silicon substrate which has its orientation along Si (100) crystallographic axis. As shown in FIG. 1, the present invention involves the deposition of a layer of single crystal cubic boron nitride 10 on silicon substrate 36 by laser ablating BN from a hexagonal boron nitride target 24. The thickness of the cubic boron nitride layer formed is in the range between 0.001 to 500 microns, preferably in the range between 0.2 to 50 microns, and more preferably in the range between 0.5 to 10 microns. The single crystal cubic boron nitride layer is formed in the presence of a nitrogen-containing atmosphere e.g., a nitrogen or nitrogen/argon atmosphere, preferably in the range between 1~100 millitorr, and more preferably in the range between 40~60 millitorr. Ionized nitrogen formed during laser ablation helps maintaining the stoichiometry of the cubic boron nitride layer.

A single crystal cubic boron nitride layer can thus be deposited on a silicon substrate by using the present improved laser ablation technique. Suitable silicon substrates include single crystal silicon materials, especially those suited for semiconductor applications, i.e. semiconductor-grade silicon substrates having (100), (110), or (111) surfaces. Most preferred are semiconductor-grade silicon substrates that has a (100) principal surface. The actual shape of the silicon substrate is not critical. Generally, silicon wafers that are adapted for fabrication of electronic devices are preferred.

The substrate surface on which a single crystal cubic boron nitride layer is deposited should be cleaned prior to the deposition process to remove any oxide layer or other possible contaminants. A conventional cleaning technique such as hydrogen fluoride etching can be used. A preferred cleaning technique is plasma etching used directly in the laser ablation chamber to remove any residual surface oxide layer by atomic hydrogen. This cleaning technique employs atomic hydrogen injectors 40 as shown in FIG. 1. By the in-situ cleaning of a silicon surface in the laser ablation chamber, the possibility of contamination during thin film growth is minimized.

Conventional laser ablation systems have been used by others to deposit thin films of materials such as cubic boron nitride. One such laser ablation system is described in Doll, et al., U.S. Pat. No. 5,139,591 in which a KrF laser operating at 248 nm is used. The present invention teaches an improved laser ablation system, as shown in FIG. 1, including a reaction chamber 20 into which a pulsed excimer laser beam 22 is introduced through a laser entry port 21. Upon entering reaction chamber 20, the excimer laser beam 22 which is focused with appropriate lenses (not shown) impinges upon the rotating ablation target 24. The target 24 is connected to a motor (not shown) whereby the target can be rotated. By adjusting the speed of rotation and the pulse rate of laser beam 22, the portion of target 24 that beam 22 strikes can be controlled.

As the pulsed excimer laser beam 22 impinges upon rotating target 24, a plume 30 of the target material is formed. One reason that the excimer laser is used in the present invention is that each photon possesses a large energy. For example, a KrF excimer laser produces 5.01 eV per photon at an oscillation wavelength of 248 nm. A $CO_2$ laser, on the other hand, only produces 0.12 eV per photon at an oscillation wavelength of 10.6 um. Another reason of utilizing a laser technique is that the laser beam can be converged with an optical system such as a focusing lens and thereby increasing the energy density. By applying a high energy laser beam on a target, a small area of the target is decomposed to generate excited species (or the "plume") to produce the cubic boron nitride film.

When laser beam 22 (FIG. 1) strikes the hexagonal boron nitride target, plume 30 generated consists of boron nitride related species. Plume 30 then travels to the heated substrate 36 where the appropriate layers are deposited. The temperature of substrate 36 should be at least 300° C. and preferably at least 400° C. It is more preferred that the temperature of substrate 36 to be in the range between 400° to 500° C. during deposition of cubic boron nitride.

The deposition of single crystal cubic boron nitride layer should take place in the presence of nitrogen. Ionized nitrogen formed during laser ablation helps to maintain the stoichiometry of cubic boron nitride.

It is a preferred practice to use at least one bias ring 32 (FIG. 1) to further energize the plume 30 during the cubic boron nitride deposition process. The use of bias ring 32 is especially beneficial in the laser ablation of a hexagonal boron nitride target. Bias ring 32 supplies additional energy to the ablation plume 30 and thus more efficiently ionizes nitrogen gas and the ablated species. The increased energy of the plume also increases the surface mobility of the deposited material and thus provides for improved bonding between the cubic boron nitride film and the substrate. The increased nitrogen ionization further reduces the nitrogen deficiency in the cubic boron nitride layer.

Bias ring 32 (FIG. 1) is positioned between target 24 and substrate 36 such that plume 30 passes through the ring. When desired, more than one bias ring can be used. The ring is fabricated from a refractory material such as molybdenum, tungsten, or the like and is isolated from the ground by an insulator. The ring is charged to a desired electrical potential, e.g. a few hundred volts, such that it supplies additional energy to the ablation plume and more efficiently ionizes nitrogen gas at near the substrate surface.

Figure 2:
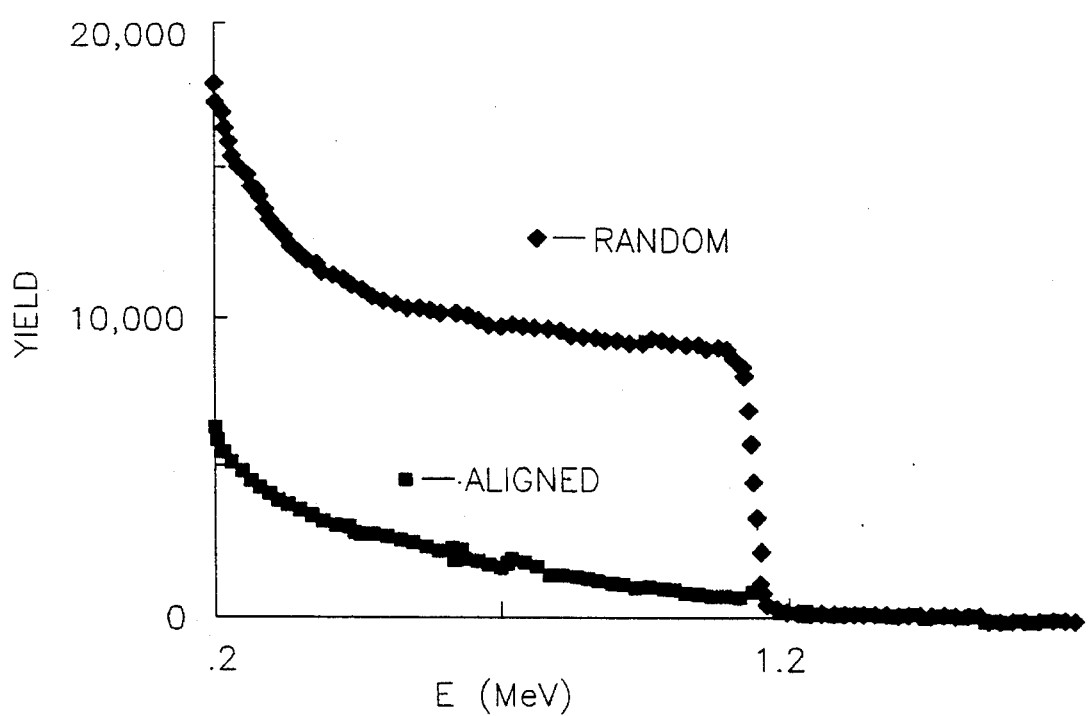
FIG. 2 is a graph showing the effect of channeling in heteroepitaxial cBN.

The increased energy in the ablation plume also facilitates the mobility of the surface atoms in the deposition layer, forming better single crystals of cubic boron nitride. The ionized nitrogen in the plasma helps to maintain the stoichiometry of the cubic boron nitride film since boron nitride from a hexagonal boron nitride target tends to become nitrogen deficient during laser ablation. The cubic allotrope of boron nitride has been observed by x-ray analysis. The heteroepitaxy of (100) cubic boron nitride on (100) Si has been verified by a channeling test. The result of a channeling test is shown in FIG. 2.

Figure 3:
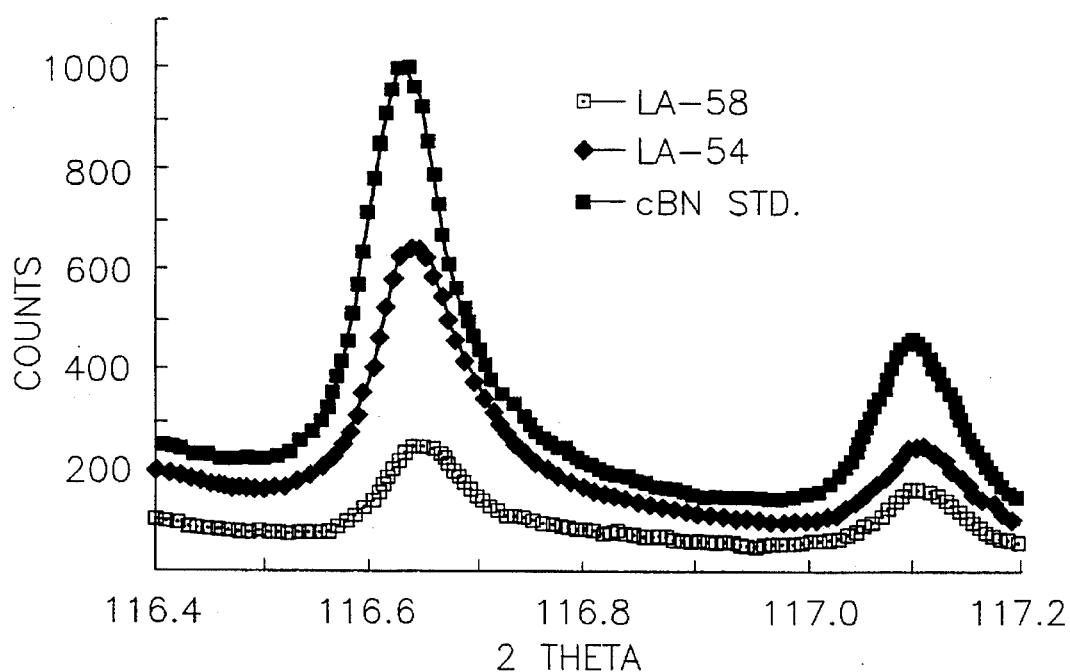
FIG. 3 is a graph showing x-ray analysis of heteroepitaxial (100) cBN on (100) Si.

An x-ray analysis of heteroepitaxial (100) cubic boron nitride on (100) Si is shown in FIG. 3. It shows an x-ray analysis of typical specimens of laser ablated heteroepitaxial cBN films fabricated by the present process. In this case, the deposition conditions were different for each film and thus resulting in different thicknesses of the film, i.e. 20 nm for LA-54, 33 nm for LA-58. A cubic boron nitride x-ray standard was made for comparison by bonding high pressure cBN abrasive crystals to a (100) silicon substrate. It should be noted that all the measured samples possess essentially the same peaks.

Figure 4:
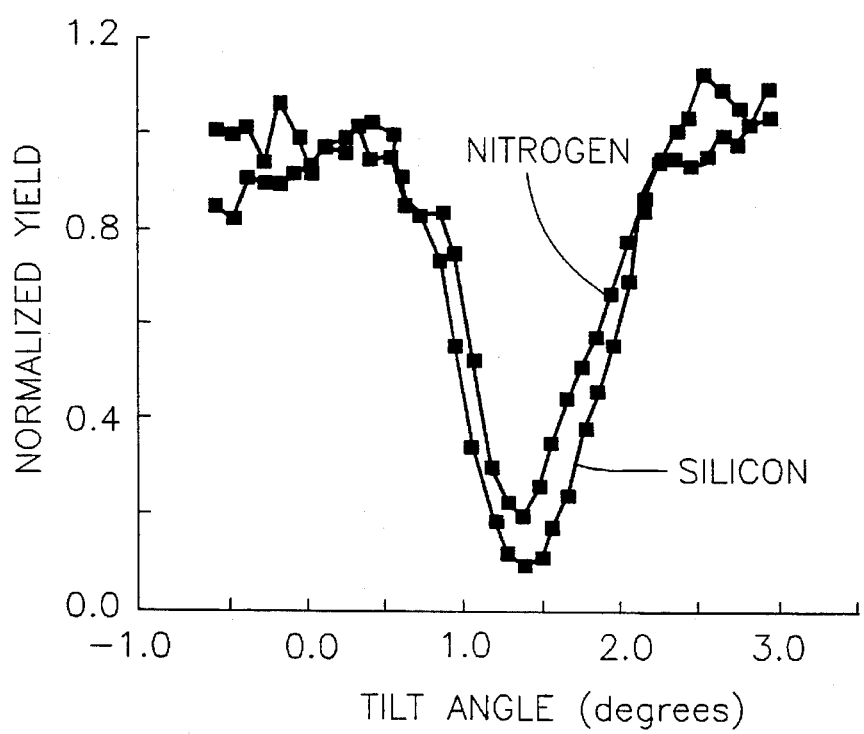
FIG. 4 is a graph showing angular scan of the backscattered yield for (100) heteroepitaxial cBN on (100) Si.

FIG. 4 shows an angular scan of the backscattered yield for (100) heteroepitaxial cBN on (100) Si. A comparison is shown between the normalized backscattering yield of 2 MeV 4 He$^+$ ions for an uncoated region on a (100) Si substrate and for an adjacent region on the same substrate coated by reactive laser ablation with a heteroepitaxial cBN film of 90 nm thick. The measured yield of the 2 MeV 4 He$^+$ ion backscattering dip for the (100) Si lattice and for the (100) N atom array of the cBN film are the same to within about 9%. This shows that the Si channels in the substrate and the N channels in the cBN film are well aligned. The small difference measured between the Si and the N values for the dip amplitude can be attributed to an inherent mismatch that is expected between the cBN and the Si lattices in the region of the interface. If the cBN lattice (3.61 Å) and the Si lattice (5.42 Å) were simply superimposed, the inherent mismatch between the lattices of these two materials should be in the order of 50%. This is obviously not the case in the present films since the residual stress would be prohibitive and would result in non-heteroepitaxial cBN films.

Figure 6:
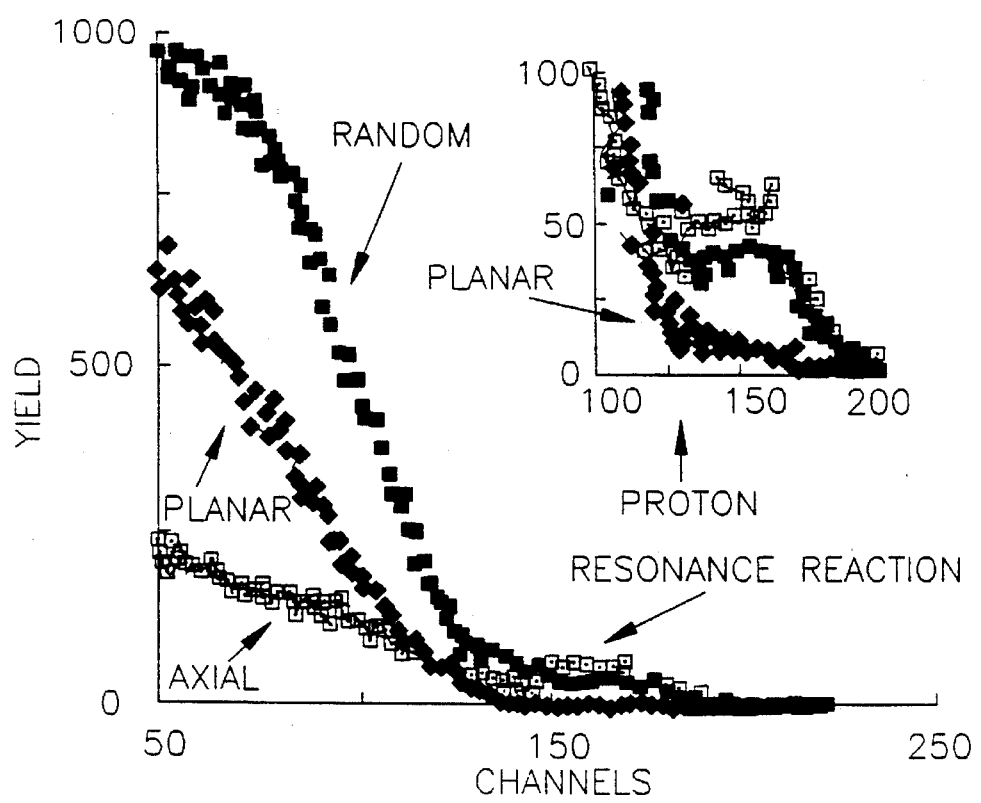
FIG. 6 is a graph showing results of proton backscatter yield and proton resonance reaction for the cBN/Si substrate under three different conditions.

A more likely paradigm for the minimization of the potential interfacial bonding mismatch is obtained by including a rotation of the cBN lattice by 45 degrees relative to the Si lattice and then allowing the cBN lattice to be modestly stretched (i.e. approximately 6%). A schematic of this particular cBN-Si interface is shown in FIG. 6. In this model, it is seen that Si atoms at the interface that connect with the overlying heteroepitaxial cBN film form bonds preferentially between the (100) Si surface and the (100) heteroepitaxial cBN surface.

Figure 5:
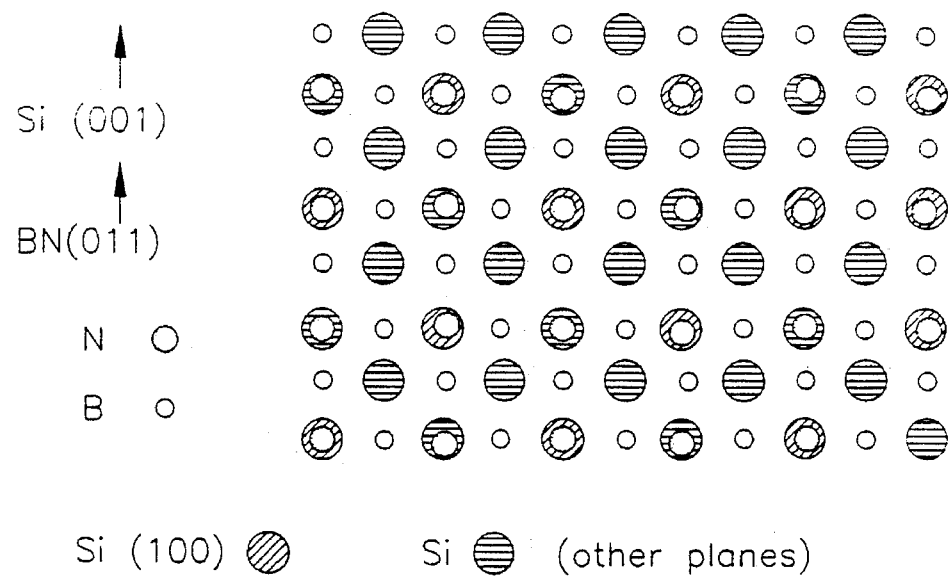
FIG. 5 is a schematic showing an interface model for heteroepitaxial (100) cBN on (100) Si.

The model shown in FIG. 5 is strongly supported by the results observed during experiments on the angular dependency of proton backscatter and the proton resonance reaction shown in FIG. 6. In this experiment, a 0.67 MeV proton is impinged on the upper surface of the heteroepitaxial cBN film. FIG. 6 shows the combined results of proton backscatter yield and proton resonance reaction for the cBN/Si substrate under three different conditions, random, planar (110), and axial (100) orientations. The lowest overall yield is in the axial (100) direction. The insert in FIG. 6 shows that the lowest yield resulted from the $^{11}B(p,\alpha)^8$ proton resonance reaction is in the planar (110) orientation, supporting the argument for the rotation of the orientation of cBN lattice by 45 degrees relative to that of Si.

EXAMPLE

A suitably cleaned silicon substrate (i.e., a silicon wafer) is positioned inside the chamber of a laser ablation apparatus equipped with a rotating target of hexagonal boron nitride (FIG. 1). The substrate is heated to 450° C. A pulsed excimer KrF laser beam operating at 248 nm with MgF$_2$ lenses is focused on the hBN target. Purified nitrogen and argon gases in a volume ratio of approximately 1:4 is metered into the reaction chamber at about 15 sccm during ablation of the hexagonal boron nitride. The ablation of the hexagonal boron nitride continues until a single crystal cubic boron nitride film of approximately 0.09 microns thickness is formed on the heated substrate.

Numerous industrial applications can be made of a silicon substrate coated with a single crystal cubic boron nitride film, for instance, applications for transistors, diodes, rectifiers, resistors or any other microelectronic devices.

While this invention has been described in an illustrative matter, it should be understood that the terminology used is intended to be in a nature of words of description rather than of limitation.

Furthermore, while this invention has been described in terms of a preferred embodiment thereof, it is to be appreciated that those skilled in the art will readily apply these teachings to other possible variations of the invention.

The embodiments of the invention in which an exclusive property or privilege is claimed are defined as follows:

1. A method of forming large area single crystal boron nitride films on silicon substrates comprising the steps of:

providing a single crystal silicon substrate having a top surface;

treating said top surface of the silicon substrate with plasma excited atomic hydrogen; and depositing a large area single crystal cubic boron nitride layer on said treated top surface in a reactive gas environment.

2. A method according to claim 1, wherein said silicon substrate having Si (100), Si (110) or Si (111) crystal planes in its top surface.

3. A method according to claim 1, wherein said silicon substrate having Si (100) crystal planes in its top surface.

4. A method according to claim 1, wherein said cubic boron nitride layer being deposited by laser ablating a hexagonal boron nitride target under biased conditions in a nitrogen/argon atmosphere.

5. A method according to claim 1, wherein said large area single crystal cubic boron nitride film being formed is about 1 cm$^2$ or greater.

6. A method according to claim 1, wherein said cubic boron nitride film being formed having a thickness of at least 0.1 nanometers.

7. A method according to claim 1, wherein said method further comprising the step of heating said silicon substrate to a temperature of about 300° C. or greater prior to said deposition step.

8. A method of forming a large area single crystal cubic boron nitride film on a silicon substrate comprising the steps of:

providing a silicon substrate having a top surface;

treating said top surface of the silicon substrate with plasma excited atomic hydrogen; and depositing a large area single crystal cubic boron nitride layer onto said treated surface of the silicon substrate by laser ablating a hexagonal boron nitride target under biased conditions in a nitrogen/argon atmosphere, whereby said layer of cubic boron nitride formed has improved purity, crystallinity and adhesion properties.

9. A method according to claim 8, wherein said silicon substrate having Si (100), Si (110) or Si (111) crystal planes in its top surface.

10. A method according to claim 8, wherein said method further comprising the step of using at least one bias ring to further energize the laser plume in said nitrogen/argon atmosphere.

11. A method according to claim 8, wherein said large area single crystal cubic boron nitride film being formed is at least 1 cm$^2$.

12. A method according to claim 8, wherein said cubic boron nitride film being formed having a thickness of at least 0.1 nanometers.

13. A method according to claim 8, wherein said method further comprising the step of heating said silicon substrate to a temperature of no less than 300° C. prior to said deposition step.

14. A single crystal cubic boron nitride coated silicon article comprising:

a single crystal silicon substrate having its top surface treated by plasma excited atomic hydrogen; and a single crystal cubic boron nitride film deposited on said silicon substrate by a reactive, biased laser ablation technique conducted in a nitrogen/argon atmosphere.

15. A single crystal cubic boron nitride coated silicon article according to claim 14, wherein said silicon substrate having Si (100), Si (110) or Si (111) crystal planes in its top surface.

16. A single crystal cubic boron nitride coated silicon article according to claim 14, wherein said single crystal cubic boron nitride film is deposited by using at least one bias ring to energize the laser plume in said nitrogen/argon atmosphere.

17. A single crystal cubic boron nitride coated silicon article according to claim 14, wherein said area of said cubic boron nitride film being at least 1 cm$^2$.

18. A single crystal cubic boron nitride coated silicon article according to claim 14, wherein said cubic boron nitride film being formed has a thickness of at least 0.1 nanometers.

19. A single crystal cubic boron nitride coated silicon article according to claim 14, wherein said silicon substrate being heated to a temperature of no less than 300° C. prior to the deposition of said cubic boron nitride film.

20. A large area single crystal cubic boron nitride film formed by the process comprising the step of depositing said film on a surface of a silicon substrate that is pretreated by plasma excited atomic hydrogen by using a reactive biased laser ablation technique in which at least one bias ring is utilized to further energize the laser plume in a nitrogen/argon atmosphere.

\* \* \* \* \*